United States Patent [19]

Hehl

[11] 4,209,154
[45] Jun. 24, 1980

[54] DEVICE FOR SECURING AN APPARATUS IN A WALL

[76] Inventor: Karl Hehl, Arthur-Hehl-Strasse 32, 7298 Lossburg 1, Fed. Rep. of Germany

[21] Appl. No.: 970,831

[22] Filed: Dec. 19, 1978

[30] Foreign Application Priority Data

Dec. 24, 1977 [DE] Fed. Rep. of Germany ....... 2757959

[51] Int. Cl.² .......................... G12B 9/00; A47B 67/02
[52] U.S. Cl. .................................. 248/27.3; 220/3.6; 312/242
[58] Field of Search ............... 248/27.3, 27.1; 174/54, 174/55, 56, 57, 58, 61; 312/242; 220/3.6; 16/DIG. 13

[56] References Cited

U.S. PATENT DOCUMENTS

| | | | |
|---|---|---|---|
| 1,398,373 | 11/1921 | Graesser et al. | 248/27.3 |
| 2,824,714 | 2/1958 | Silvey | 248/27.3 |
| 3,561,068 | 2/1971 | Croxson | 248/27.3 |
| 3,848,764 | 11/1974 | Salg | 220/3.6 |
| 3,852,513 | 12/1974 | Flahive | 248/27.3 |
| 3,989,343 | 11/1976 | Lucius et al. | 248/27.3 |
| 4,063,660 | 12/1977 | Ware | 220/3.6 |
| 4,080,522 | 3/1978 | Schimmels | 248/27.3 X |
| 4,159,405 | 6/1979 | Semonchick | 248/27.3 |

FOREIGN PATENT DOCUMENTS

| | | |
|---|---|---|
| 2029607 | 12/1971 | Fed. Rep. of Germany . |
| 2226315 | 7/1973 | Fed. Rep. of Germany . |
| 2538083 | 3/1977 | Fed. Rep. of Germany . |
| 1574181 | 7/1969 | France . |
| 761605 | 11/1956 | United Kingdom . |
| 996330 | 6/1965 | United Kingdom . |
| 1282546 | 7/1972 | United Kingdom . |

*Primary Examiner*—James T. McCall
*Attorney, Agent, or Firm*—Schwartz, Jeffery, Schwaab, Mack, Blumenthal & Koch

[57] ABSTRACT

A device is disclosed for securing a substantially rigid housing containing an apparatus such as a readable instrument in a receiving wall. The device includes a mounting frame with resiliently movable locking tongues projecting in opposite directions from a wall of the frame. One set of locking tongues, in cooperation with an abutment shoulder of the frame serves to lock the frame with respect to the receiving wall. Another set of locking tongues, in cooperation with another abutment surface serves to lock the instrument housing in the device.

9 Claims, 7 Drawing Figures

DEVICE FOR SECURING AN APPARATUS IN A WALL

BACKGROUND (1) Field of the Invention

The invention relates to a device for securing a substantially rigid housing in a wall provided with an aperture, the housing containing an instrument or apparatus, for example, a meter.

(2) Description of the Prior Art

It has already been proposed to provide abutment shoulders and locking tongues which can be pressed-in elastically on the partly elastically deformable lock case of a lock for the releasable securing of the lock in the aperture of a door leaf. When the lock case is inserted in the aperture of the door leaf, the locking tongues snap into engagement elastically and engage behind the door leaf in the locking position. In this position the lock case abuts with its abutment shoulders on the door leaf (German laid-open specification No. 26 54 591.5).

SUMMARY

The invention on the other hand has as its object to arrange a device of the type specified initially as a coupling element making it possible to connect a substantially rigid housing without tools and in an easily releasable manner to a wall, for example the sheet metal wall of a switch cabinet or a switch board.

This object is achieved according to the invention in that the wall element, situated at right angles to the reception wall, of a mounting frame made of elastically deformable material which comprises abutment shoulders abutting on the wall and which extends through the aperture, is provided with locking tongues which project out of the plane of the frame wall element in oppositely directed manner, which are adapted to be pressed-in elastically in the direction of the said plane, and which are provided with sliding surfaces which form an acute angle relatively to the aforesaid plane, and in part engage behind the reception wall and in part behind the housing, which abuts on mounting frame abutment surfaces which are arranged substantially parallel to the reception wall.

That is, the device of the invention secures a substantially rigid housing containing an apparatus in a receiving wall having inner and outer sides. The device includes a mounting frame of elastically deformable material, the frame including a frame wall element. The frame also includes an abutment shoulder for engagement with the outer side of the receiving wall. Additionally, the frame includes first and second locking tongues projecting from the frame wall element in opposite directions with respect to the frame wall element, the tongues being elastically movable toward each other and toward the frame wall element. The first locking tongue is adapted for engagement with the inner side of the receiving wall, and the second locking tongue is adapted for engagement with the housing containing the apparatus. The frame further includes an abutment surface disposed in opposed relationship to the second locking tongue, the abutment surface being adapted for engagement with the housing of the apparatus.

The features according to the invention ensure economical series production of the device, which constitutes a mass produced article and consists of very few or preferably only one injection moulding of high-polymer material for use as the coupling element.

Further features of the invention will be described hereinafter.

The invention is discussed hereinafter with reference to constructional examples shown in the drawings.

DETAILED DESCRIPTION OF THE PREFERRED EMBODIMENT

Figure 3:
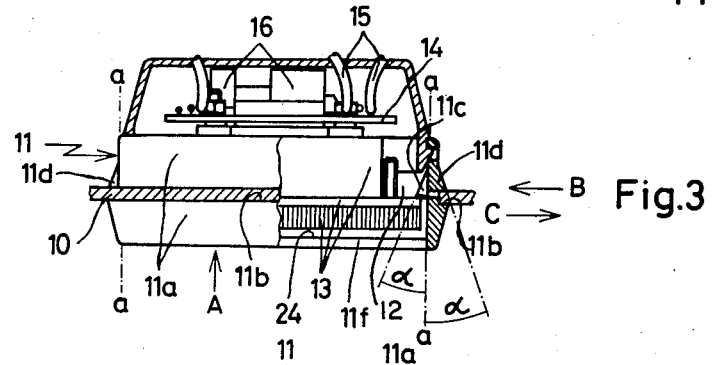
FIG. 3 shows a view from above, partly in section, of the arrangement shown in FIG. 1.
Figure 4:
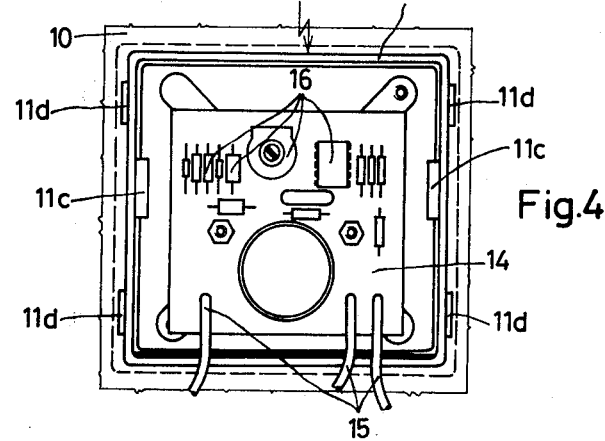
FIG. 4 shows a rear view of the arrangement according to FIG. 1 without the rear cover.
Figure 5:
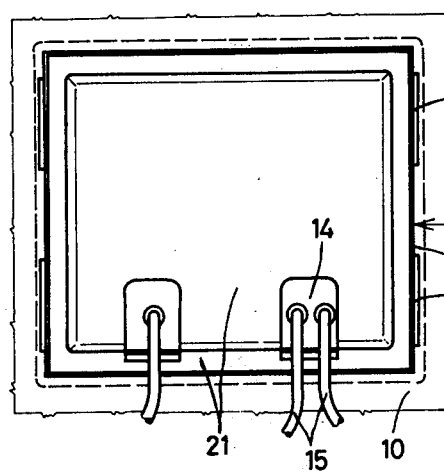
FIGS. 5 through 7 show a modified form of the device in views corresponding to FIGS. 4, 2 and 3.
Figure 6:
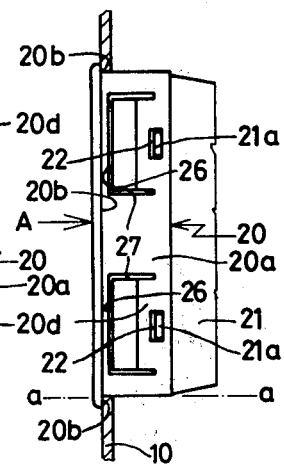
Figure 7:
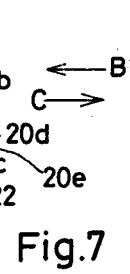

The device is arranged as a mounting frame 11 (in FIGS. 1 to 4, and 20 in FIGS. 5 to 7, respectively) this frame being used as a coupling element. It will be immediately apparent from the drawing that mounting frame 11 defines an internal area 12 therewithin and that mounting frame 20 defines an internal area 23 therewithin. The mounting frame in its geometric basic shape corresponds to the shape of the aperture in the reception wall 10, for example a wall of a switch cabinet or a switch board within the cabinet. As the drawings show, the mounting frame extends through the aperture in the reception wall 10 at least partly and in the coupling position abuts by means of abutment shoulders 11$b$ (in FIGS. 1 to 4) and 20$b$ (in FIGS. 5 to 7) respectively on the end face of the wall 10. The frame wall element 11$a$ (FIGS. 1 to 4) situated at right angles to the reception wall 10 or 20$a$ respectively (FIGS. 5 to 7), is provided with locking tongues 11$c$, 11$d$ (in FIGS. 1 to 4) and 20$c$, 20$d$ respectively (in FIGS. 5 to 7). The locking tongues project from the plane a—a of the frame wall element in oppositely directed manner. They are adapted to be pressed-in elastically in the direction of this plane and are provided with sliding surfaces. The sliding surfaces enclose an acute angle $\alpha$ (FIGS. 3, 7). The locking tongues engage in part behind the wall 10 and in part behind the housing 13 accommodating the meter. The housing 13 abuts on abutment surfaces 24 of the mounting frame 11 (FIGS. 1, 4) or 20 respectively (FIGS. 5, 7) which extend substantially parallel to the wall 10. The locking tongues 11$c$ (FIGS. 1 to 4) or 20 (FIGS. 5 to 7) respectively, which engage behind the housing 13 project inwards with respect to the internal area (12 in FIGS. 1–4 or 23 in FIGS. 5–7), i.e. in the direction B of FIGS. 3, 7 from the plane a—a of the frame wall element 11$a$ or 20$a$ respectively. Those locking tongues 11$d$, 20$d$ which engage behind the wall 10 project outwardly with respect to the same internal area, that is to say in the direction C of FIGS. 3 and 7 out of the plane a—a.

Figures 1, 2:
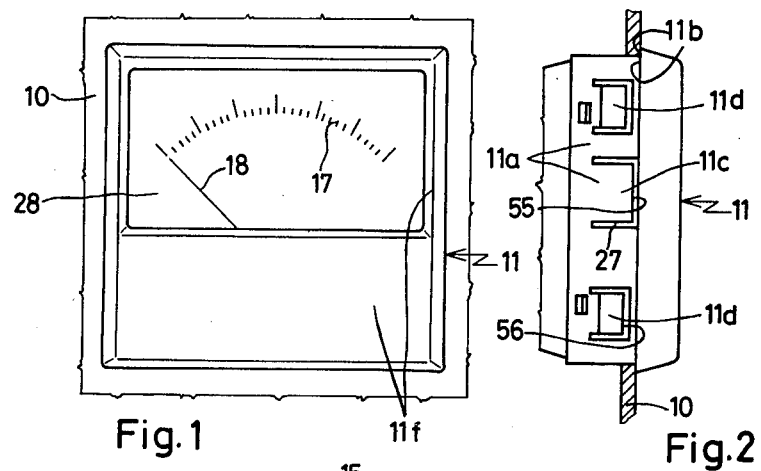
FIG. 1 shows a front view of part of a wall in the region of the coupled-on apparatus.
FIG. 2 shows the device secured on the wall and arranged as a coupling element (the meter has been omitted in order to leave the drawing easier to read)

In the constructional example shown in FIGS. 1 and 4, and 5 to 7 respectively, the mounting frame 11, 20 comprises at least two sides opposite one another and in each case three locking tongues 11$c$, 11$d$ and 20$c$, 20$d$ respectively. Of these, the marginal locking tongues 11$d$ or 20$d$ respectively engage behind the mounting frame 11 or 20 respectively, whilst the central locking tongues 11c or 20c respectively, engage behind the housing 13. In both constructional examples those abutment surfaces 24 of the mounting frame 11 or 20 respectively which are remote from the direction A in which the apparatus is read (FIGS. 3, 7) are formed by a partial wall element 11f, 20f respectively extending approximately parallel to the reception wall 10. As FIG. 1 shows more particularly, this partial wall element is an end wall of the frame which closes the frame but leaves an opening for reading the position of the pointer 18 on the scale 17 in the viewing window 28 of the meter. In the constructional example shown in FIGS. 1 to 4, the locking surfaces 55 of the locking tongues 11c engaging behind the apparatus are situated approximately at the level of the locking surfaces 56 of the locking tongues 11d engaging behind the reception wall. In this example the locking tongues are all portions of the frame wall element 11a separated from the element on three sides by a gap 27. In the example shown in FIGS. 5 to 7 this is not the case with the locking tongue 20c which engages behind the housing. As FIG. 7 shows, these locking tongues 20c are formed on tabs 30e of the partial wall element 20f. The tabs extend parallel to the frame wall element 20a and at a spacing therefrom. The locking tongues 20c are bent over portions of the tabs 20e. As seen in the drawings, locking tongues 20c and 20d include locking surfaces 25 and 26, respectively. It will be apparent from the foregoing and from the drawing that locking surfaces 55 (FIG. 2) and 25 (FIG. 7) are disposed generally parallel to the receiving wall 10 and adapted for face-to-face locking engagement with one surface of the instrument housing. It will also be apparent that abutment surface 24 (both embodiments) is disposed in opposed parallel relationship with the locking surfaces (55 in FIG. 2 and 25 in FIG. 7) of the locking tongues 11c or 20c and faces toward these locking surfaces. It is further apparent that this abutment surface and these locking surfaces are spaced approximately the same distance apart as the mounting surfaces of the instrument housing so that the instrument housing is locked between this abutment and these locking surfaces as shown and described.

In the two constructional examples illustrated, the apparatus concerned is a moving coil meter whose scale and pointer are arranged in a substantially rectangular end face portion of the housing 13 and whose coil and rotary bearings and other electrical parts are arranged in an adjoining cylindrical housing part. Electronic components 16 are secured on a plate 14 with a printed circuit. From this plate, electrical connections 15 lead to the electronic rotational speed meter. In the example shown in FIGS. 1 to 7 the mounting frame 20 and thus the meter itself are covered at the rear by means of a cover 21. The catches 21a of the cover are used for locking into the mounting frame. The catches engage from the inside into recesses 22 of the frame wall element 20a. To this extent the frame wall element 20a engages partly about the cover.

What is claimed is:

1. A device for securing a substantially rigid housing containing an apparatus in a receiving wall having inner and outer sides, the housing having a pair of mounting surfaces facing away from each other in opposite directions, the mounting surfaces being spaced a certain distance apart from each other, the device comprising:
   (a) a mounting frame of elastically deformable material, said frame including a frame wall element, said frame defining an internal area therewithin;
   (b) said frame including an abutment shoulder for engagement with the outer side of the receiving wall;
   (c) said frame including first and second locking tongues projecting from said frame wall element in opposite directions with respect to said frame wall element, said tongues being elastically movable toward each other and toward said frame wall element;
   (d) said first locking tongue extending outwardly with respect to said internal area and being adapted for engagement with the inner side of the receiving wall, said second locking tongue extending inwardly with respect to said internal area and having a locking surface disposed generally parallel to the receiving wall and adapted for face-to-face, locking engagement with one mounting surface of the housing containing the apparatus;
   (e) said frame including a partial wall element extending approximately parallel to the receiving wall when the device is installed, said partial wall element providing an abutment surface disposed in opposed, parallel relationship with the locking surface of the second locking tongue and facing toward the locking tongue, said abutment surface being adapted for engagement with the other mounting surface of the housing of the apparatus, said abutment surface and said locking surface being spaced approximately the same distance apart as the mounting surfaces of the housing of the apparatus to lock the housing between said abutment surface and said locking surface.

2. A device according to claim 1, wherein at least part of said frame wall element is disposed generally in a plane which, after installation in the receiving wall, is generally perpendicular to the receiving wall and wherein said second locking tongue projects inwardly from said plane of said frame wall element and wherein said first locking tongue projects outwardly from said plane.

3. A device according to claim 1 wherein said mounting frame comprises at least two sides opposite one another, each side of said frame including two of said first locking tongues and one of said second locking tongues disposed between said first locking tongues.

4. A device according to claim 1, wherein said partial wall element includes a tab, said tab being situated parallel to said frame wall element and spaced therefrom, said second locking tongue being formed on said tab.

5. A device according to claim 4, wherein said second locking tongue is a bent-over portion of said tab.

6. A device according to claim 2, wherein said first and second locking tongues include sliding surfaces which form an acute angle with said plane of said frame wall, said first and second locking tongues also including, respectively, first and second locking edges, said first and second locking edges being situated approximately at the same level.

7. A device according to claim 5, wherein the apparatus contained in the substantially rigid housing is an instrument having a face which may be read in a reading direction and wherein said locking edges of all said locking tongues are disposed in opposed relationship to the reading direction.

8. A device according to claim 2, wherein said first and second locking tongues are portions of said frame wall element separated from the said element on three sides by a gap.

9. A device according to claim 1, including a cover adapted to be locked to said frame at a rear side thereof, said rear side being disposed opposite said abutment shoulder.

* * * * *